United States Patent [19]

Tkacik

[11] Patent Number: 5,142,170
[45] Date of Patent: Aug. 25, 1992

[54] HIGH REPETITION RATE SIGNAL REJECT APPARATUS AND METHOD

[75] Inventor: Mark J. Tkacik, Lilburn, Ga.

[73] Assignee: Rockwell International Corporation, Seal Beach, Calif.

[21] Appl. No.: 676,689

[22] Filed: Mar. 28, 1991

[51] Int. Cl.$^5$ ............................ H03K 5/00; H03K 5/22
[52] U.S. Cl. ..................................... 307/520; 307/521; 307/527; 328/167; 364/794.01
[58] Field of Search ....................... 307/520, 521, 527; 328/167; 364/724.01, 724.04

[56] References Cited

U.S. PATENT DOCUMENTS

| 3,935,392 | 1/1976 | Smith et al. | 328/164 |
| 4,953,116 | 8/1990 | Nelson | 364/724.01 |
| 4,958,311 | 9/1990 | Kadowaki et al. | 364/724.01 |
| 5,043,653 | 8/1991 | Foster et al. | 364/724.01 |
| 5,043,722 | 8/1991 | Aggers et al. | 307/520 |

FOREIGN PATENT DOCUMENTS

| 58-107713 | 6/1983 | Japan | 364/724.01 |
| 60-137117 | 7/1985 | Japan | 364/724.01 |

Primary Examiner—Eugene R. LaRoche
Assistant Examiner—Tan Dinh
Attorney, Agent, or Firm—V. Lawrence Sewell; H. Fredrick Hamann

[57] ABSTRACT

A circuit is illustrated for eliminating a repetitiously occurring or constant frequency pulse signal from a train of signal pulses. The design is such that a plurality of such circuits can be connected in series to eliminate several of various frequency repetitious pulse signals, leaving only asynchronous signals in the pulse stream presented to downstream circuitry. The concept used is to record the time between two pulses and delete the passage of any signal during a time subsequent to the second of the two pulses by an amount equal to the difference between the first two pulses. If a pulse is detected during that time window, the circuit continues to blank out the passage of pulses for as long as a pulse is detected during the time window. If a predetermined maximum has not been exceeded, in the situation where no pulse is detected in the first time window blank, the original count is continued until a third pulse is detected and the time between the first pulse and the third pulse is recorded and used as the basis for possible repetition time interval for blanking.

9 Claims, 3 Drawing Sheets

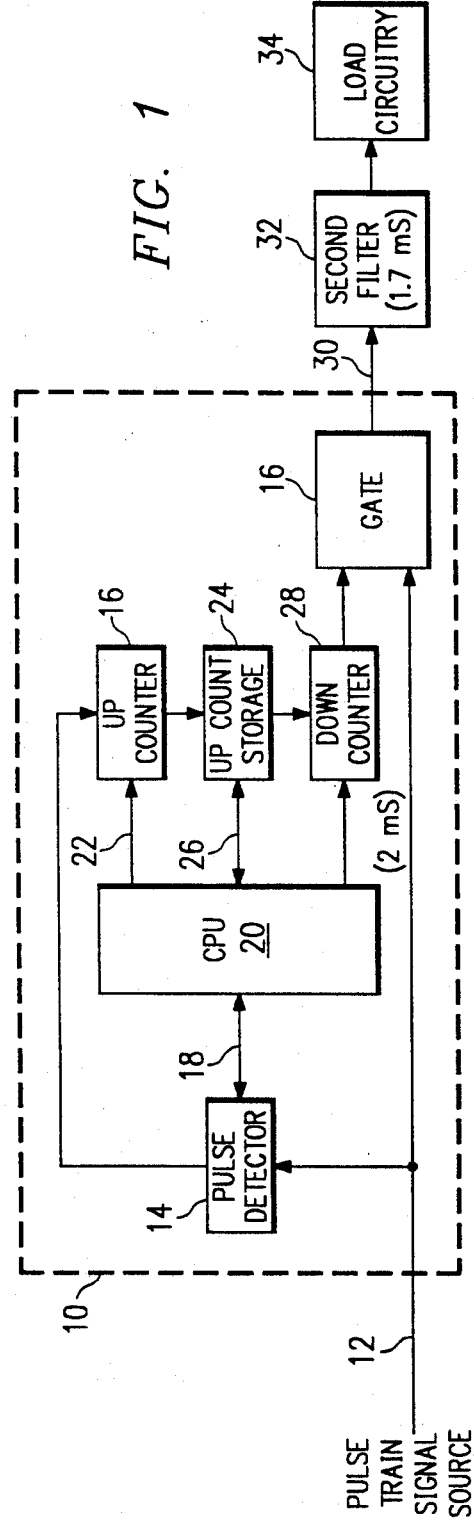
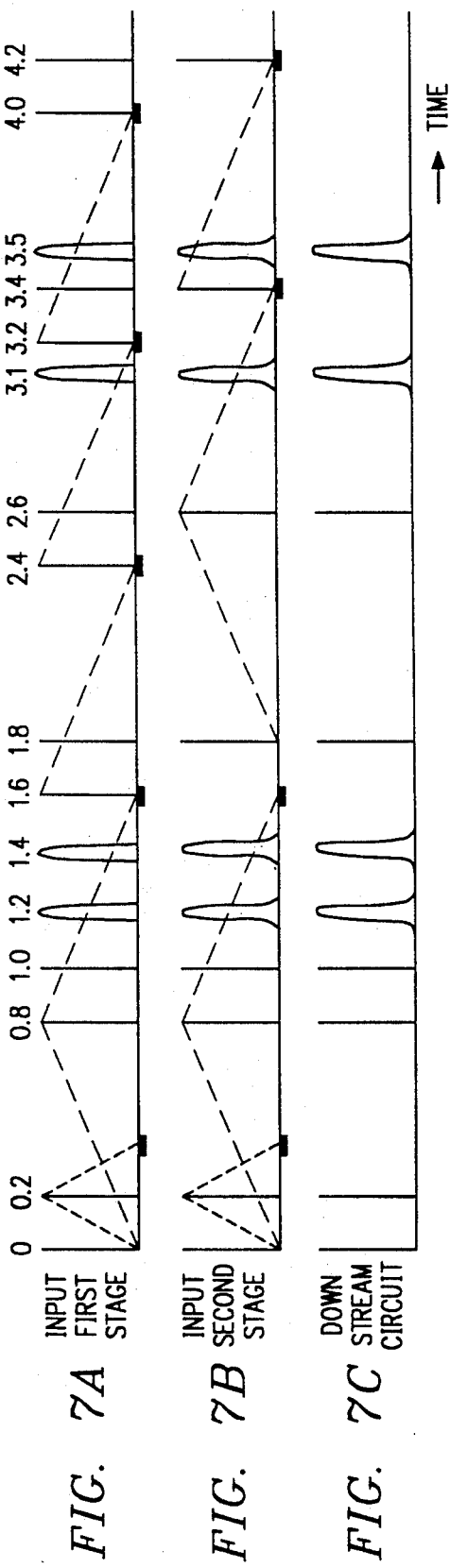

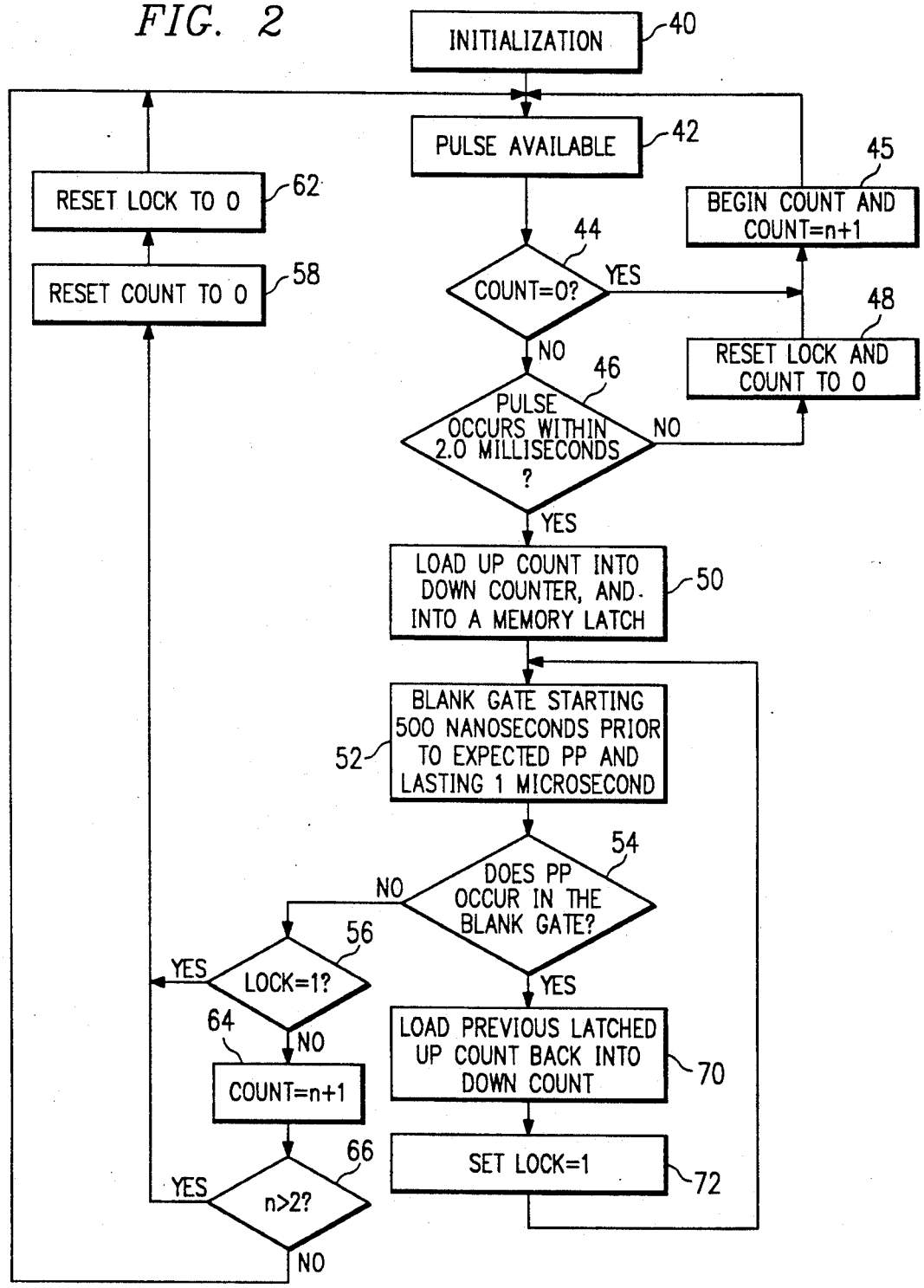

HIGH REPETITION RATE SIGNAL REJECT APPARATUS AND METHOD

THE INVENTION

The present invention is generally concerned with electronics and more specifically concerned with pulse signal filtration circuitry. Even more specifically, the present invention is concerned with filtering out repetitiously occurring signals from a train of signal pulses to reduce the signal processing load on downstream circuitry.

BACKGROUND

There are many situations where circuitry has to analyze and evaluate various pulses in a signal train. A part of this processing may include attempting to synchronize with a known but apparently randomly spaced set of signal pulses (pseudorandom). When the pulse train includes additional repetitiously occurring signal pulses, the detection circuitry can become overloaded with signals to process and accordingly, is sometimes unable to properly perform its intended detection or synchronization function.

It is accordingly desirable, depending upon the frequency of the potentially interfering signals to provide a low-pass, a high-pass, or possibly a bandpass filter for eliminating the repetitiously occurring signals from the train of signal pulses prior to the train of pulses being presented to the detection circuitry. The present invention illustrates in detail a filter which may be designated as a low-pass filter in that repetitiously occurring signal pulses of a low frequency are passed while high frequency repetitiously occurring pulses are deleted and non-repetitiously occurring signals are only randomly deleted, when they happen to occur at substantially the same time as a repetitiously occurring signal, with the random deletions being few enough so as to not substantially affect the performance of the detection circuitry downstream.

The present invention accomplishes the deletion of the repetitiously occurring signals by placing one or more circuits of the present design in series between the signal source and the synchronization circuitry downstream to be protected. Each circuit counts the time between a first pulse and a subsequent pulse. The time between the first pulse and the subsequent pulse is placed in a down counter. When the down counter reaches substantially zero, a blanking signal is applied to the pulse train to delete any signals from passing to the downstream circuitry. If a pulse is detected coincident with the blanking signal, it is assumed that a repetitious signal has been detected. The down counter is then again loaded with the previously loaded count for as long as a pulse is detected coincident with the blanking signal. When a pulse is no longer detected as being received during (coincident with) the blanking signal, the circuit starts a new measurement and blanking cycle. If, on the first up count timing attempt, a pulse is not detected subsequent to the further signal, and if a predetermined maximum time has not been exceeded, the circuit checks for any further received signal pulses, and if any signal is detected, this new count is supplied to the down counter, and a check is made to see if a further repetitiously occurring signal is received coincident with the time that the down counter again approaches a zero count. The feature of returning to the original up count if a signal is not detected immediately subsequent to the initial pulse and first subsequent pulse helps eliminate confusion to the filter in situations where there are two interfering repetitiously occurring signals where the phase of one is slightly offset from the other. The first filter in a tandem set of two can eliminate the first repetitiously occurring signal, and the second filter can shortly thereafter eliminate the second repetitiously occurring signal. This leaves the remaining asynchronous signal pulses to be applied to downstream detection circuitry.

It is therefore an object of the present invention to provide a repetitiously occurring pulse rate reject or filter circuit.

Other objects and advantages of the present invention will be apparent from a reading of the specification and appended claims in conjunction with the drawings wherein:

FIG. 1 is a block diagram of one embodiment of the inventive concept;

FIG. 2 is a flow diagram of the operation of the circuit and in particular of the CPU of FIG. 1; and FIGS. 4 through 7 comprise waveforms used in explaining the operation of FIGS. 1 and 2.

DETAILED DESCRIPTION

Figure 3A:
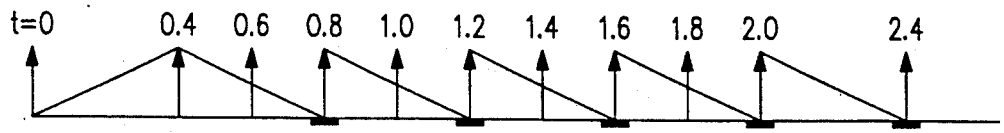

In FIG. 1 a dash line block 10 receives a pulse train from a signal source on a lead 12. The signal is supplied from lead 12 to a pulse detector 14 and to a gate circuit 16 within block 10. An output of the pulse detector is supplied to an up counter 16. Signals are passed in both directions on a lead 18 between pulse detector 14 and a CPU 20. Signals are also passed from CPU 20 to up counter 16 on a lead 22. The count from up counter 16 is loaded into an up count storage block 24, and signals are passed in both directions between up count storage 24 and CPU 20 on a lead 26. The stored count from 24 is supplied to a down counter 26 which also receives control signals from CPU 20. The down counter 26 provides an output to gate 16 when it is at substantially zero count. An output of gate 16 is connected via a lead 30 to a second filter 32 containing the same circuitry as dash line block 10. The filter 32 is then connected to some type of load circuitry 34. As will be explained later in the Operation, the first filter 10 has a two millisecond maximum repetition period interval, and the second filter has a 1.7 millisecond maximum interval repetition period. While both of these can be the same, the two filters have been illustrated as having different values to show versatility of the concept.

In FIG. 2 a flow diagram is illustrated of the operation of one of the filter blocks such as 10 in FIG. 1. As illustrated, a block 40 provides initialization for the software in CPU 20 to await the arrival of a pulse. If a pulse is available, the system goes from a block 42 to decision block 44. If the count is zero as would be the case when the first pulse of an attempt is received, the decision block 44 proceeds to block 45 to begin counting in the up counter 16, and the count is set to "1". The flow diagram then returns to pulse available block 42 to await the second or further pulse. On receipt of the next pulse, the count is no longer "1" so the system proceeds to decision block 46. Block 46 illustrates that if this pulse or any further pulse being considered is not received within two milliseconds, the system proceeds to block 48 to reset the lock and count to zero and then to block 45 to begin a new count with that pulse being considered as the first pulse of a series of possible repetitiously occurring pulses. If, on the other hand, the pulse is within the prescribed amount of two milliseconds as set forth in the flow diagram, the system proceeds to block 50. In block 50, the count from the up counter 16 is loaded into memory latch or up count storage block 24 and then into down counter 28. As the down counter 28 approaches zero, a block 52 shows that the blank gate 16 is turned to a condition where signals on lead 12 are prevented from passing to lead 30 at a time approximately slightly prior to the time the down counter would reach zero. In one embodiment of the invention the blanking lasts for one microsecond, thus, eliminating the passage of a signal with less than one microsecond pulse width for a one microsecond blanking gate interval. The CPU 20 checks to see whether or not pulse detector 14 detects a further pulse during the blanking time in block 54. If it does not detect a further pulse, the system passes to a block 56. If the lock flag has been set to one, the system continues to a block 58 because it is apparent that synchronization has been lost. In block 58, the count in the up counter 16 is set to zero, and the lock flag is set to zero in a block 62 before returning to block 42 to recommence searching for a further pulse. If, however, the lock flag was not set to zero in accordance with the decision block 56, the system proceeds to block 64 where the count is incremented. If count is greater than "2", the system returns to block 58 to reset the count and lock to zero and return to block 42 to look for another pulse. If the count is not greater than "2", the system returns to block 42 to await the next pulse. If the next pulse is received within the two millisecond time of block 46, the system will use that pulse as a time interval for possible synchronization and deletion. Returning back to decision block 54, if the pulse occurred within the blanking gate, the system proceeds to block 70 to load the latched memory count as set forth in block 50 into the down counter. The action of block 72 sets lock equal to "1" to show that synchronization has occurred with a repetitively occurring signal, and as long as a pulse is found to occur within the blanking gate in block 54, the filter will continuously remove that specific repetitiously occurring pulse.

Figure 3B:
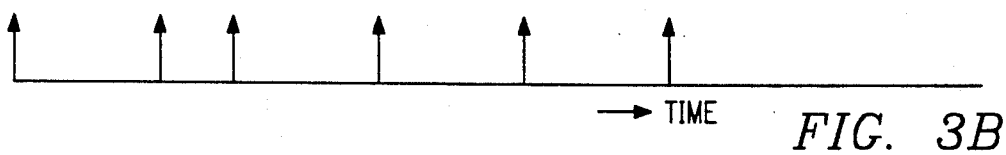

In FIG. 3 a set of pulses is shown in waveform A (FIG. 3A) from time equals zero to time equals 2.4 units. Waveform A represents the pulses on lead 12 before being applied to the filter system block 10. The pulses on waveform B (FIG. 3B) of FIG. 3 illustrate the signal appearing on lead 30 as applied to the second filter 32. The black spaces beneath the baseline of waveform 3A at 0.8, 1.2, 1.6, 2.0 and 2.4 time units is representative of the timing gate during which gate 16 of FIG. 1 does not pass any pulse signals. Thus, these pulses do not appear in the waveform B of FIG. 3.

Figure 4A:
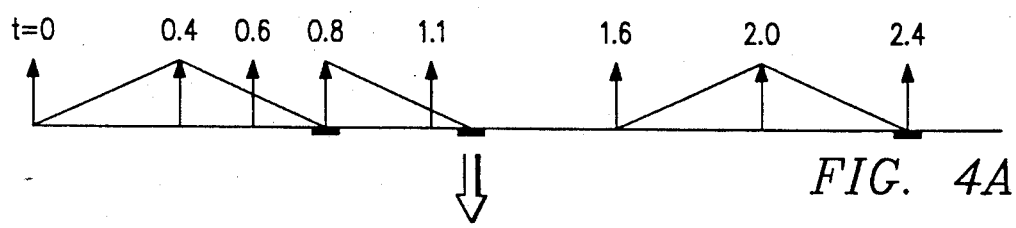
Figure 4B:

FIG. 4 has a set of waveforms A (FIG. 4A) and B (FIG. 4B) structured on the same basis as FIG. 3. Whereas FIG. 3 shows a locked condition with the repetitiously occurring pulse being eliminated, FIG. 4 illustrates a condition where after initial lock at time unit 0.8, the system finds that there is no pulse occurring at the predicted time of the second expected pulse such that the system tries again at time unit 1.6 to obtain lock which it appears to have accomplished at time unit 2.4. Waveform B of FIG. 4 again shows the pulses that are transmitted on lead 30 to the second filter 32.

FIG. 5 again shows two waveforms A (FIG. 5A) and B (FIG. 5B) using similar scenarios to that indicated with connection with FIGS. 3 and 4, and showing that the system attempts to find repetition with the pulse occurring at 0.4 time unit and finds that no pulse occurs at time unit 0.8. The system then goes back and continues the originally initiated count and finds a further pulse at time unit 1.2. The system then continues at the 1.2 time unit repetition rate and finds locking pulses at time units 2.4, 3.6 and 4.8 to remove from the train of pulses appearing on lead 12. As shown on waveform B, these pulses have been removed from the train appearing in waveform A.

FIG. 6 illustrates a final condition. It also illustrates the situation where the filter device attempts to lock on at a repetition rate of 0.4 time units and finds that there is no pulse occurring at 0.8. It then continues counting until it receives another pulse at 2.4. At this time it determines that the 2.00 maximum time has been exceeded so the pulse at 2.4 initiates a new cycle of synchronization attempts so as to remove each pulse occurring after 2.8 time units based on the 0.4 time unit interval repetition rate.

FIG. 7 has waveforms A, B, and C (FIGS. 7A, 7B, and 7C) with waveform A being the signals on lead 12 of FIG. 1, the signals in waveform B being those appearing on lead 30, and the signals in waveform C being those appearing at the output of the second filter 32. As illustrated, the gate or filter of block 10 acts to remove the repetitiously occurring signals at 0.8 time unit intervals starting from time zero, and the second filter of waveform B acts to remove another set of 0.8 time unit interval pulses which occur a short time after the 0.8 time unit interval pulses eliminated by the first filter. As illustrated, the narrow pulses are the interfering pulses and the wider pulses are the desirable ones for purposes of illustration and as illustrated, the desirable pulses are the only ones left at the far right of waveform C and thus can be acted upon by the load circuitry of block 34 in FIG. 1.

OPERATION

As mentioned previously, the basic operation of a single unit of the pulse repetition rate filter such as 10 is designed to detect a pulse and upon the detection of a first occurrence of a pulse to start up counter 16. When a second pulse is detected, the up count is transferred to up count storage means 24 and to down counter 28. The down counter 28 counts down by the amount that the up counter 16 had counted up before encountering the second pulse. Shortly before the down counter 28 reaches zero, a blanking gate is commenced which extends past the time of the down counter 28 reaching zero. This then prevents any signal pulses from passing from lead 12 to lead 30 for a very short period of time. This may be possibly better observed by looking at FIG. 3 where the first pulse is encountered at time zero, and the second pulse is encountered at time 0.4. This 0.4 time is loaded into the down counter 28, and the down counter starts counting towards zero. The pulse that is received at 0.6 is ignored because the down counter 28 has not finished counting toward zero. At a time slightly before the time that down counter 28 reaches zero, a gate signal is applied to gate 16 to prevent passage of the pulse occurring at 0.8. Looking at waveform B of FIG. 3, it will be noted that the 0.8 pulse does not appear at the output of the filter. All of these actions are shown in blocks 42, 44, 45, 46, 50 and 52 of FIG. 2. If a pulse is received during the blanking gate, the program proceeds to block 70 where the previous up count is loaded back into the down counter, and an indication is set that a lock has occurred on a repetitiously occurring signal as set forth in block 72, and the system returns to block 52 to start a blanking gate at some prescribed time prior to the expected pulse presence (PP). Thus, referring again to FIG. 3, it will be noted that the same repetition period of 0.4 would occur at 1.2 in FIG. 3A and again, the system ignores the pulse occurring at 1.0. FIG. 3 illustrates a condition of lock and the continuous removal of the interfering signal occurring on a 0.4 basis. Although the flow diagram mentions that it checks to see whether or not a pulse occurs within two milliseconds, and further that the blank gate starts slightly prior to the expected pulse presence, the numbers listed can be any suitable window time for block 52, and the time within block 46 is merely representative of the longest interval between repetitious pulses that can be deleted or, in other words, the lowest frequency pulses occurring on a repetitious basis that can be deleted.

The waveforms of FIG. 4 illustrate the situation where locking has occurred at the first gate time of 0.8, but no repetitiously occurring pulse is found at 1.2. In such an instance, the flow diagram of FIG. 2 proceeds to block 56. Since lock had occurred in block 72 at time 0.8, the program proceeds to reset the count to zero in block 58 and reset lock to zero in block 62 and proceed to the initial block 42 to check out the next pulse which, as shown in FIG. 4A, is received at 1.6. Lock again occurs at 2.4. In other words, as shown on waveform B of FIG. 4, only two incoming pulses of the pulse train are actually removed in the time period shown.

Figure 5A:
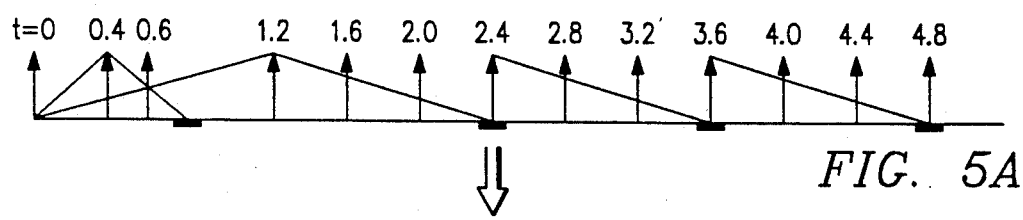
Figure 5B:
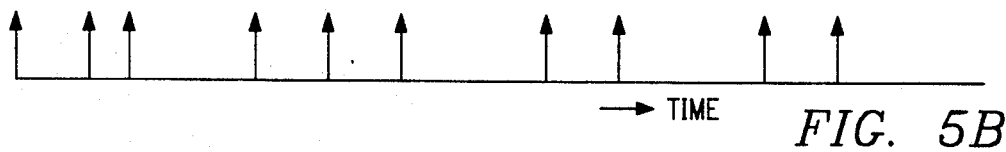

Referring to FIG. 5, a slightly different situation is shown where a first pulse is received at time zero, and the flow diagram of FIG. 2 changes the count to one in block 45, and when the second pulse occurs at 0.4, the system goes to block 46 and finds that it has occurred within the two milliseconds and thus, loads the down counter and proceeds to block 52. At the expected pulse position of 0.8 in block 54, no pulse occurs, and the system goes to block 56. Since no locking had occurred previously, the system goes to block 64 and increments the count to two and proceeds to block 66. Since the count had not exceeded two but rather is exactly two, the system returns to block 42 and awaits the next pulse. As shown in FIG. 5A, the next pulse occurs at 1.2. The flow diagram continues to block 44, and since the count is not equal to zero, it continues to 46 to check if it occurred within two milliseconds. Since the pulse did occur within two milliseconds, the new count of 1.2 is loaded into the down counter and into a memory latch, and the system continues to block 52 to start a timing gate at the appropriate time surrounding the time 2.4. When a pulse is found at 2.4 within the timing gate, the system continues to block 70 and stays in the locked mode until a signal is no longer received within the blanking gate. In other words, as illustrated, the pulses are deleted from the pulse train of waveform B of FIG. 5 on each 1.2 time unit subsequent to the second occurrence at 1.2.

Figure 6A:
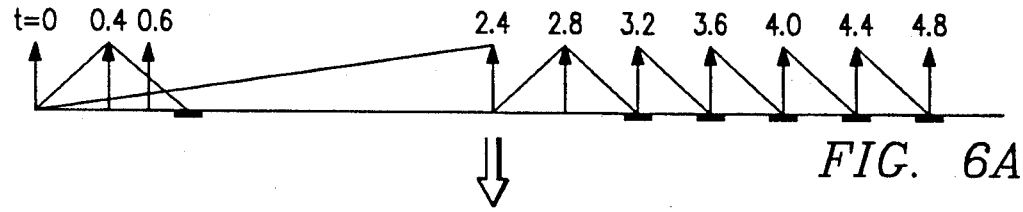
Figure 6B:
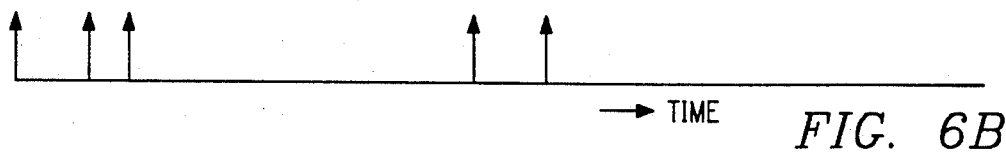

FIG. 6 illustrates the situation where the first pulse occurs at 0.4, and the flow diagram goes down to block 54 and finds that no pulse has occurred at 0.8 and thus, it goes through blocks 56, 64 and 66 since the count is only up to two. The flow diagram goes back to block 42 to await the next pulse. As shown, it occurs at 2.4 and thus, at the time of this pulse the flow diagram goes to block 44 and finds that the count is two rather than zero and continues to block 46. Since the 2.4 pulse exceeds the two millisecond stated maximum, it proceeds to block 48 to reset the count and lock indicators, and then proceeds to block 45 to begin the count. At this time, it awaits the next pulse which, as shown in FIG. 6A, occurs at 2.8, and lock is illustrated as occurring at 3.2 so as to remove the remaining repetitiously occurring pulses from waveform B (FIG. 6B) of FIG. 6. The number used as the maximum for block 66 may be dependent on how many filter stages are used in series and to a greater or lesser extent on the number of potentially interfering repetitiously occurring but slightly out-of-phase pulse trains that the circuit is designed to eliminate. As shown in FIG. 1, the present invention in one embodiment had two separate filters so as to take care of the situation of two slightly out-of-phase repetitiously occurring pulses. These are shown in FIG. 7.

In FIG. 7 the pulses that the down stream or load circuitry 34 wants to examine are shown as being wider than the interfering pulses, although this is just for ease of discussion and illustration. As shown, both the filters 10 and 32 would receive the pulse occurring at time zero and would attempt to lock on to the slightly out-of-phase pulse occurring at 0.2. Both circuits would find that there wasn't a repetitiously occurring pulse at 0.4, and thus would return in the flow diagram through blocks 56, 64 and 66 to the pulse available block 42 and await the next pulse at 0.8. Since there is no blocking at this time, each of the filters 10 and 32 receive the pulse at 0.8. Further, the two millisecond time limit of block 46 (and the 1.7 millisecond time limit of filter 32) has not been exceeded at 0.8. At time 1.6, the gate of filter 10 removes the pulse, and the gate of filter 32 fails to find a pulse at 1.6 as shown in waveform B of FIG. 7. Since the filter 32 does not find a pulse at 1.6, it proceeds from decision block 54 to decision block 56. Since lock had not occurred, it continues to decision block 66 and finds that the count has not exceeded two. It thus continues to block 42 and awaits the next available pulse. The next available pulse causes the system to proceed to block 44 where it determines that the count is not zero and thus, it proceeds to block 46. Block 46 indicates that the second pulse does not occur within the 1.7 millisecond time limit of filter 32 and thus, proceeds to block 48 to reset the lock and count to zero and begin the count so as to start a timing sequence as shown. The filter 32 then locks on the interval of 0.8 seconds at the 3.4 indicated time to remove the pulse shown and remains in the locked condition on the repetitiously occurring signal which occurs slightly later than the repetitiously occurring signal locked upon by filter 10.

The present invention has been illustrated showing two different filters substantially identically constructed, but with one having a time out of two milliseconds and the other having a time out of 1.7 milliseconds. (The time outs could be the same.) Further, the maximum count for the block 66 in flow diagram, FIG. 2, could be the same or different for each of the filters depending upon the desires of the designer. Additionally, more than the two filters shown could be used if it was expected that more than two different interfering pulse signals could occur in addition to the pulses that would normally be analyzed by the load circuitry. Additional filter stages could also be used to simplify the design of this concept in providing the pulse repetition time ranges required to provide bandpass or high-pass filtering.

In summary, the present invention is designed to reduce the work load by analytical circuitry in removing repetitiously occurring signals from a pulse train of pulse signals where the analytical circuitry is only designed to work on signals outside the frequency range of those being removed or on non-synchronous signals. The present invention will remove repetitious signals either on a high-pass, low-pass or bandpass situation for repetitiously occurring signals so as to reduce the amount of analysis that must be performed by the load circuitry 34.

In view of the above, I wish to be limited not by the specific embodiment illustrated and described but only by the scope of the appended claims wherein I claim:

1. The method of providing a filter for a repetitious signal of greater than a predetermined repetition rate comprising the steps of:
   a. commencing a first timing count upon receipt of a first pulse;
   b. commencing a second timing count upon receipt of a second pulse, the second timing count being indicative of the time between receipt of said first and second pulse;
   c. preventing passage of any signal to down-stream circuitry during a blanking gate interval substantially centered at a time subsequent to said second pulse which equals the count of said first timing count at the time of receipt of said second pulse;
   d. returning to step (b) if no pulse is received during the gate interval and another pulse is received before the limits of said first timing count is exceeded;
   e. returning to step (c) for preventing passage of any signals to down-stream circuitry during similar gate intervals on a further repetitious basis for as long as pulses are received during subsequent gate intervals; and
   f. returning to step (a) when a gate interval occurs, subsequent to at least one successful pulse deletion, wherein no pulse is received.

2. The method of deleting a repetitious signal from passage through a gate circuit intermediate detection circuitry and further downstream circuity comprising the steps of:
   a. detecting the occurrence of a first signal pulse;
   b. commencing a predetermined maximum duration timing count from the time of occurrence of said first signal pulse;
   c. detecting the occurrence of a further signal pulse, subsequent to said first signal pulse and occurring prior to said predetermined maximum duration;
   d. recording the value of the timing count of step (b) at the time of the receipt of the pulse detected in step (c) as a signal pulse reject repetition period;
   e. turning a gate circuit to an OFF condition for a predetermined blanking gate interval which covers a time subsequent to the time of occurrence of said pulse detected in step (c) equal to the value of the most recently recorded repetition period;
   f. repeating step (e) for as many consecutive times as a pulse is received during the OFF period of step (e);
   g. returning to step (c) when both (1) a pulse was not received during the OFF period of step (e) AND (2) the original maximum duration timing count for a given synchronization attempt has not been exceeded; and
   h. returning to step (a) when (1) a pulse was not received during the OFF period of step (e) AND (2) the original maximum duration timing count for a given synchronization attempt has been exceeded.

3. Apparatus for deleting a repetitious signal of greater than a given frequency from passage through a gating type circuit intermediate detection circuitry and further downstream circuitry comprising in combination:
   pulse detection means for detecting the occurrence of pulses of electrical energy and providing an output indicative thereof;
   downstream circuitry to be protected from repetitious signals of given frequency ranges;
   gating means, connected intermediate said pulse detection means and said downstream circuitry and including gating signal means responsive to a control signal to prevent the passage of specific signal pulses to said downstream circuitry;
   timing means, connected to said pulse detection means and said gating means, for commencing a predetermined maximum duration timing count from the time of occurrence of a first signal pulse;
   recording means, connected to said pulse detection means and said timing means, for recording the time of occurrence of a further signal pulse, subsequent to said first signal pulse and occurring prior to said predetermined maximum duration;
   blanking gate interval means, connected to said recording means, said pulse detection means and said gating means, for supplying a control signal to said gating means for turning said gating means to a condition for preventing signal passage for a repetitiously occurring gate interval coincident with an extension of said first and further signal pulses and the recorded time difference therebetween; and
   repeating means, comprising a part of said gate interval means, for repeating the gate interval for as long as a pulse is detected coincident therewith by said pulse detection means.

4. The method of preventing passage of a repetitiously occurring signal pulse comprising the steps of:
   detecting the time difference between first and second pulses in a train of received pulses being applied to downstream circuitry where the time difference lies between predetermined maximum and minimum values;
   momentarily preventing passage of any signal pulses in said train of received pulses to downstream circuitry during a blanking gate interval subsequent to said second pulse based on the time difference between said first and second pulses; and
   continuing the momentary prevention of signal passage on a periodic basis for as long as a signal pulse is detected during the interval of passage prevention.

5. The method of preventing passage of a repetitiously occurring signal pulse comprising the steps of:
   selecting two signal pulses in a train of received signal pulses being supplied to downstream circuitry;
   assuming that the selected signal pulses comprise a repetitious signal to be barred from downstream circuitry; and
   preventing passage of further signals from said train of received signal pulses during the predicted time of receipt of future pulses based on the time difference between the two selected signal pulses for as long as a signal pulse is actually received during the passage prevention time.

6. Apparatus for preventing passage, of a repetitiously occurring signal pulse in a train of received signal pulses, to downstream circuitry comprising, in combination:

selection means for selecting two signal pulses in a train of received signal pulses being supplied to downstream circuitry; and detection and prevention means for preventing passage of further signals from said train of received signal pulses during a predicted time of receipt of future pulses based on the time difference between the two selected signal pulses for as long as a signal pulse is actually detected as being received during the passage prevention time.

7. Apparatus for removing a plurality of repetitiously occurring signal pulses in a train of received signal pulses before the remaining pulses of the train are applied to downstream circuitry comprising, in combination:

input means for supplying a train of signal pulses;
load circuitry;

first and second filter circuits each preventing passage therethrough of a set of signals occurring at a repetitious interval by counting the time between receipt of the first two signals applied subsequent to the occurrence of a start mode as a defined "repetition interval" and using a delay thereafter, of slightly less than said "repetition interval", to create a continuously occurring signal passage preventing gate interval lasting somewhat longer than the time of any expected pulse to be removed and declaring a "lock" condition for as long as at least one pulse is received by a given filter circuit during each of said gate intervals; and means for connecting said first and second filter circuits in series between said input means and said load circuitry.

8. Apparatus as claimed in claim 7 comprising, in addition:

circuitry in each of said filter circuits for continuing the count started by the first of the said two signals while checking to see if a "lock" condition will occur and continuing the search for a further pulse signal to use as a newly defined "repetition interval" if a pulse is not found concurrent with the first generated gate interval.

9. Apparatus for removing repetitiously occurring signal pulses in a train of received signal pulses before the remaining pulses of the train are applied to downstream circuitry comprising, in combination:

input means for supplying a train of signal pulses;
load circuitry;

filter circuit means for preventing passage therethrough of a set of signals occurring at a repetitious interval by counting the time between receipt of the first two signals applied subsequent to the occurrence of a start mode as a defined "repetition interval" and using a delay thereafter, of slightly less than said "repetition interval" to create a repetitively occurring signal passage preventing gate interval lasting somewhat longer than the time of any expected pulse to be removed, and declaring a "lock" condition for as long as at least one pulse is received by a given filter circuit during each of said gate intervals;

means comprising a part of said filter circuit means for continuing the count started by the first of the said two signals while checking to see if a "lock" condition will occur and continuing the search for a further pulse signal to use as a newly defined "repetition interval" if a pulse is not found concurrent with the first generated gate interval; and means for connecting said filter circuit means in series between said input means and said load circuitry.

* * * * *